US 9,825,219 B2

(12) United States Patent
Ahn

(10) Patent No.: US 9,825,219 B2
(45) Date of Patent: Nov. 21, 2017

(54) MAGNETIC MEMORY DEVICES

(71) Applicant: Sungmin Ahn, Hwaseong-si (KR)

(72) Inventor: Sungmin Ahn, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/136,875

(22) Filed: Apr. 22, 2016

(65) Prior Publication Data

US 2016/0365506 A1 Dec. 15, 2016

(30) Foreign Application Priority Data

Jun. 11, 2015 (KR) .................. 10-2015-0082711

(51) Int. Cl.
| *H01L 43/08* | (2006.01) |
| *H01L 43/10* | (2006.01) |
| *G11C 11/16* | (2006.01) |
| *H01L 43/02* | (2006.01) |

(52) U.S. Cl.
CPC ............ *H01L 43/08* (2013.01); *G11C 11/161* (2013.01); *H01L 43/02* (2013.01); *H01L 43/10* (2013.01)

(58) Field of Classification Search
CPC .......... H01L 43/02; H01L 43/08; H01L 43/10; G11C 11/14–11/16; G11C 11/161
See application file for complete search history.

(56) References Cited

U.S. PATENT DOCUMENTS

| 6,831,312 | B2 | 12/2004 | Slaughter et al. | |
| 7,149,105 | B2 | 12/2006 | Brown et al. | |
| 7,332,781 | B2 | 2/2008 | Nozieres et al. | |
| 7,672,093 | B2 | 3/2010 | Horng et al. | |
| 7,999,337 | B2 | 8/2011 | Zheng et al. | |
| 8,094,421 | B2 * | 1/2012 | Lin ........................ | B82Y 10/00 360/324.11 |
| 8,169,817 | B2 * | 5/2012 | Nakayama ............. | B82Y 25/00 365/158 |
| 8,279,661 | B2 | 10/2012 | Ogimoto et al. | |
| 8,279,666 | B2 * | 10/2012 | Dieny .................... | B82Y 25/00 365/157 |
| 8,411,498 | B2 | 4/2013 | Kim et al. | |
| 8,416,618 | B2 | 4/2013 | Gaudin et al. | |
| 8,675,309 | B2 | 3/2014 | Braganca et al. | |
| 8,729,648 | B2 | 5/2014 | Suzuki et al. | |
| 2004/0041183 | A1 | 3/2004 | Slaughter et al. | |
| 2005/0040433 | A1 | 2/2005 | Nozieres et al. | |
| 2005/0185454 | A1 | 8/2005 | Brown et al. | |
| 2008/0088986 | A1 | 4/2008 | Horng et al. | |
| 2010/0284217 | A1 | 11/2010 | Ogimoto et al. | |

(Continued)

FOREIGN PATENT DOCUMENTS

| JP | 4954445 | 3/2012 |
| JP | 5545532 | 5/2014 |

(Continued)

*Primary Examiner* — Allison P Bernstein
(74) *Attorney, Agent, or Firm* — Renaissance IP Law Group LLP

(57) ABSTRACT

Embodiments of the inventive concepts provide magnetic memory devices. The magnetic memory device includes a magnetic tunnel junction including a free layer, a pinned layer, and a tunnel barrier layer between the free layer and the pinned layer. The free layer includes a perpendicular magnetic material doped with non-magnetic impurities.

18 Claims, 7 Drawing Sheets

(56) References Cited

U.S. PATENT DOCUMENTS

| | | | |
|---|---|---|---|
| 2011/0007430 A1 | 1/2011 | Zheng et al. | |
| 2011/0141803 A1 | 6/2011 | Kim et al. | |
| 2012/0020152 A1 | 1/2012 | Gaudin et al. | |
| 2013/0161768 A1 | 6/2013 | Khvalkovskiy et al. | |
| 2013/0222949 A1 | 8/2013 | Braganca et al. | |
| 2013/0285176 A1 | 10/2013 | Suzuki et al. | |
| 2014/0056061 A1 | 2/2014 | Khvalkovskiy et al. | |
| 2014/0151831 A1* | 6/2014 | Chen | H01L 43/08 257/427 |
| 2014/0169085 A1* | 6/2014 | Wang | G11C 11/161 365/158 |

FOREIGN PATENT DOCUMENTS

| | | |
|---|---|---|
| KR | 20130071467 | 6/2013 |
| KR | 101397654 | 5/2014 |

\* cited by examiner

MAGNETIC MEMORY DEVICES

CROSS-REFERENCE TO RELATED APPLICATION

This U.S. non-provisional patent application claims priority under 35 U.S.C. §119 to Korean Patent Application No. 10-2015-0082711, filed on Jun. 11, 2015, in the Korean Intellectual Property Office, the disclosure of which is hereby incorporated by reference in its entirety.

BACKGROUND

The inventive concepts relate to magnetic memory devices and, more particularly, to magnetic memory devices including a free layer doped with non-magnetic impurities.

As high speed lower power electronic devices have been demanded, high speed lower power semiconductor memory devices have also been increasingly demanded. To satisfy these demands, magnetic memory devices have been developed as the semiconductor memory devices. The magnetic memory devices are spotlighted as next-generation semiconductor memory devices because of their potential of high-speed and non-volatile characteristics.

Generally, the magnetic memory device may include a magnetic tunnel junction (MTJ) pattern. The MTJ pattern may include two magnetic bodies and an insulating layer disposed between the two magnetic bodies. A resistance value of the MTJ pattern may be changed depending on relative magnetization directions of the two magnetic bodies. For example, the MTJ pattern may have a great resistance value when the magnetization directions of the two magnetic bodies are anti-parallel to each other, and the MTJ pattern may have a small resistance value when the magnetization directions of the two magnetic bodies are parallel to each other. Logical data may be written into and sensed from the MTJ pattern by means of a difference between the resistance values.

SUMMARY

Embodiments of the inventive concepts may provide magnetic memory devices having low power consumption and excellent magnetic tunnel junction characteristics.

In one aspect, a magnetic memory device may include a magnetic tunnel junction including a free layer, a pinned layer, and a tunnel barrier layer between the free layer and the pinned layer. The free layer may include a perpendicular magnetic material doped with non-magnetic impurities.

In an embodiment, the non-magnetic impurities may include a transition metal or a rare-earth element.

In an embodiment, the non-magnetic impurities may have an atomic number equal to or greater than 30 and smaller than 60. In this case, a concentration of the non-magnetic impurities included in the free layer may range from about 1 at % to about 10 at %.

In an embodiment, the non-magnetic impurities may have an atomic number equal to or greater than 60. In this case, a concentration of the non-magnetic impurities included in the free layer may range from about 1 at % to about 5 at %.

In an embodiment, the non-magnetic impurities may have a spin-orbit coupling constant equal to or greater than 250 $cm^{-1}$ and smaller than 1000 $cm^{-1}$. In this case, a concentration of the non-magnetic impurities included in the free layer may range from about 1 at % to about 10 at %.

In an embodiment, the non-magnetic impurities may have a spin-orbit coupling constant equal to or greater than 1000 $cm^{-1}$. In this case, a concentration of the non-magnetic impurities included in the free layer may range from about 1 at % to about 5 at %.

In an embodiment, the free layer may include a crystal lattice formed by the perpendicular magnetic material, and the non-magnetic impurities may be located in interstitial sites of the crystal lattice.

In an embodiment, the free layer may have a magnetization direction tilted at an acute angle from a direction perpendicular to a top surface of the free layer.

In an embodiment, the angle between the magnetization direction of the free layer and the direction perpendicular to the top surface of the free layer may increase as a concentration of the non-magnetic impurities increases.

In an embodiment, the free layer may include a plurality of magnetic domains, and each of the magnetic domains may have a magnetization direction tilted at an acute angle from the direction perpendicular to the top surface of the free layer.

In an embodiment, the pinned layer may have a magnetization direction perpendicular to the top surface of the free layer.

In an embodiment, spin-orbit interaction may occur between the perpendicular magnetic material and the non-magnetic impurities.

In an embodiment, the spin-orbit interaction may be Dzyaloshinskii-Moriya interaction.

In another aspect, a magnetic memory device may include a magnetic tunnel junction including a free layer, a pinned layer, and a tunnel barrier layer between the free layer and the pinned layer. The free layer may have a magnetization direction tilted at an acute angle from a direction perpendicular to a top surface of the free layer. The pinned layer has a magnetization direction perpendicular to the top surface of the free layer In an embodiment, the free layer may include a perpendicular magnetic material doped with non-magnetic impurities, and the angle between the magnetization direction of the free layer and the direction perpendicular to the top surface of the free layer may increase as a concentration of the non-magnetic impurities increases.

In an embodiment, the free layer may include a plurality of magnetic domains, and each of the magnetic domains has a magnetization direction tilted at an acute angle from the direction perpendicular to the top surface of the free layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
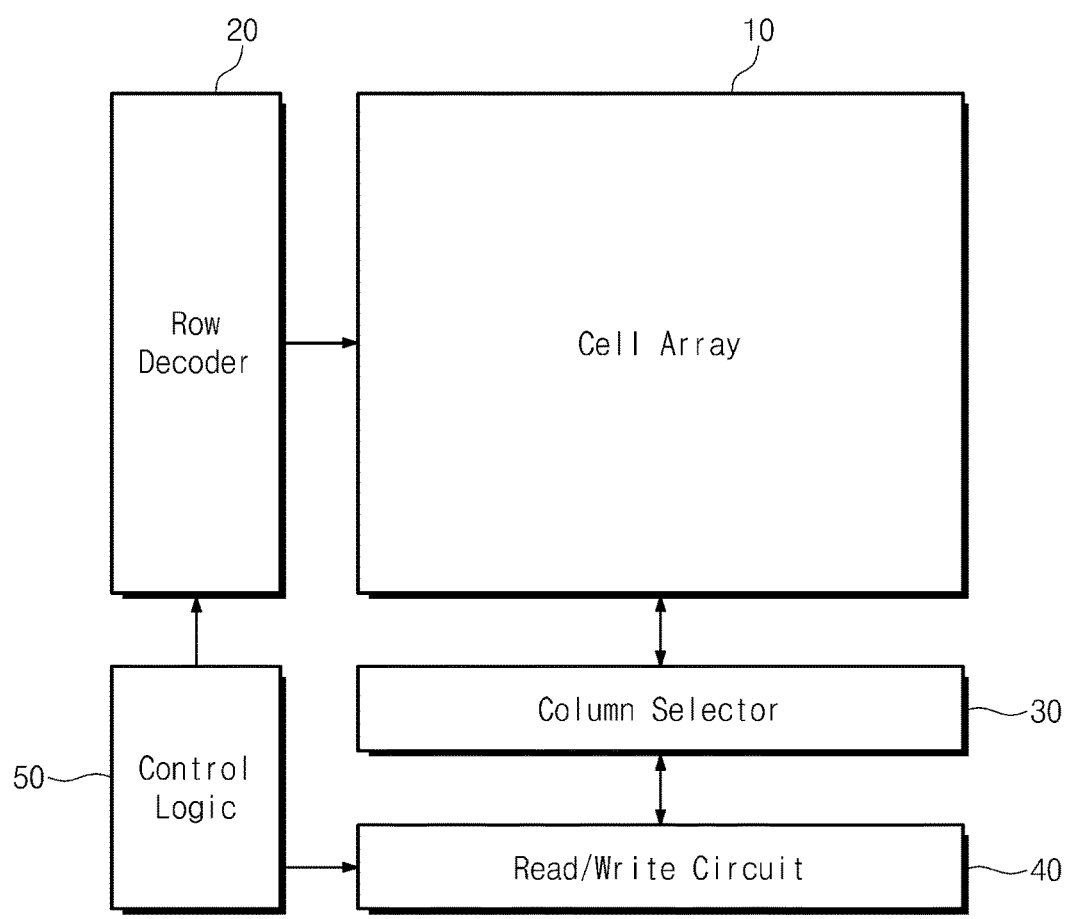
FIG. 1 is a schematic block diagram illustrating a magnetic memory device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," an and the are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, exemplary embodiments are described herein with reference to cross-sectional views and/or plane views that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a schematic block diagram illustrating a magnetic memory device according to example embodiments of the inventive concepts.

Referring to FIG. 1, a magnetic memory device may include a memory cell array 10, a row decoder 20, a column selector 30, a read/write circuit 40, and a control logic circuit 50.

The memory cell array 10 may include a plurality of word lines, a plurality of bit lines, and unit memory cells respectively connected to crossing points of the word lines and bit lines. The memory cell array 10 will be described 1 ater in more detail with reference to FIG. 2.

The row decoder 20 may be connected to the memory cell array 10 through the word lines. The row decoder 20 may decode an address signal inputted from an external system to select one of the word lines.

The column selector 30 may be connected to the memory cell array 10 through the bit lines and may decode an address signal inputted from the external system to select one of the bit lines. The bit line selected by the column selector 30 may be connected to the read/write circuit 40.

The read/write circuit 40 may provide a bit line bias for accessing a selected memory cell in response to a control signal of the control logic circuit 50. The read/write circuit 40 may provide a bit line voltage to the selected bit line to write or read data into or from the selected memory cell.

The control logic circuit 50 may output control signals controlling the magnetic memory device in response to a command signal provided from the external system. The control signals outputted from the control logic circuit 50 may be used to control the read/write circuit 40.

Figure 2:
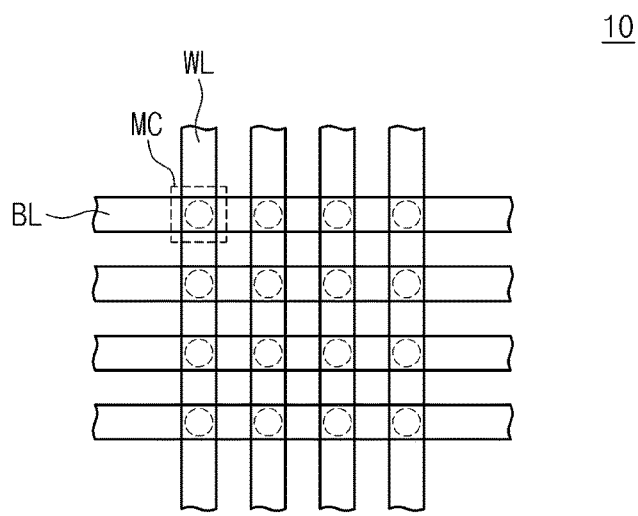
FIG. 2 is a schematic plan view illustrating a memory cell array of a magnetic memory device according to example embodiments of the inventive concepts.

FIG. 2 is a schematic plan view illustrating a memory cell array of a magnetic memory device according to example embodiments of the inventive concepts.

Referring to FIG. 2, the memory cell array 10 may include a plurality of word lines WL, a plurality of bit lines BL crossing the word lines WL, and unit memory cells MC. The unit memory cells MC may be two-dimensionally arranged. The unit memory cells MC may be connected to crossing points of the word lines WL and the bit lines BL, respectively. In other word, each of the unit memory cells MC may be connected between the word line WL and the bit line BL which form each of the crossing points. Each of the word lines WL may be connected to a plurality of the unit memory cells MC. The unit memory cells MC connected to each of the word lines WL may be connected to the bit lines BL, respectively. Thus, each of the unit memory cells MC connected to each of the word lines WL may be connected to the read/write circuit 40, described with reference to FIG. 1, through each of the bit lines BL.

Figure 3:
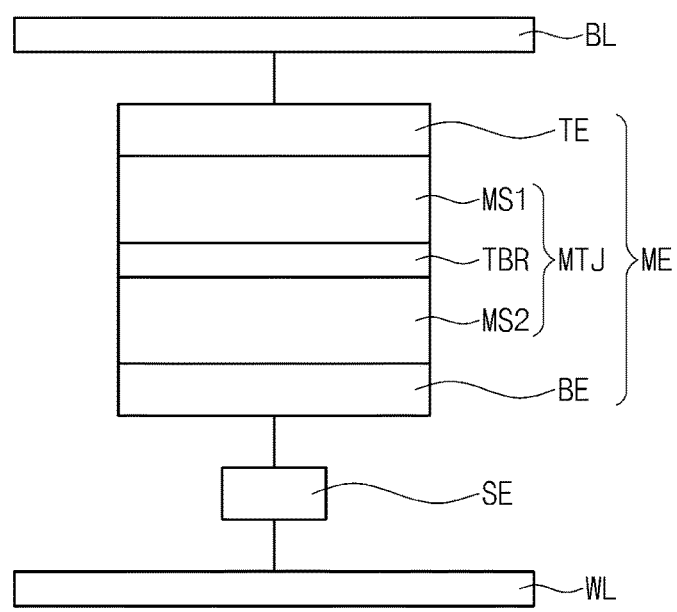
FIGS. 3 and 4 are views illustrating unit memory cells of a magnetic memory device according to example embodiments of the inventive concepts.
Figure 4:
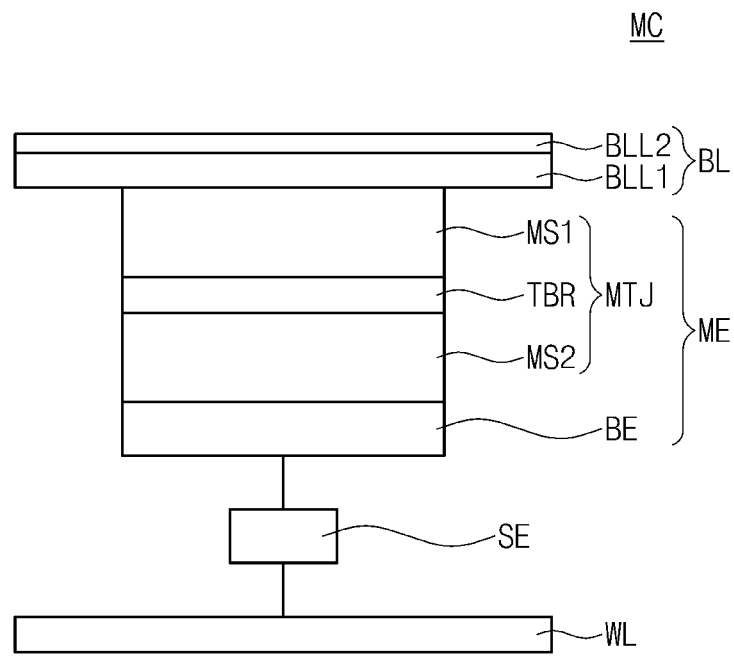

FIGS. 3 and 4 are views illustrating unit memory cells of a magnetic memory device according to example embodiments of the inventive concepts.

Referring to FIGS. 3 and 4, each of the unit memory cells MC may include a selection element SE and a memory element ME. The selection element SE may be connected between the memory element ME and the word line WL, and the memory element ME may be connected between the bit line BL and the selection element SE.

The selection element SE may be configured to control a flow of charges passing through the memory element ME. For example, the selection element SE may be a diode, a PNP bipolar transistor, an NPN bipolar transistor, an NMOS field effect transistor, or a PMOS field effect transistor. If the selection element SE is the bipolar transistor or MOS field effect transistor having three terminals, an additional interconnection (not shown) may be connected to the selection element SE.

The memory element ME may be a variable resistance element which is switchable between two resistance states by an electric and/or magnetic pulse applied thereto. The resistance state of the memory element ME may be changeable by the following methods.

In an embodiment, as illustrated in FIG. 3, the memory element ME may have a thin-layer structure of which an electrical resistance value is changeable using spin transfer torque caused by a current passing through the thin-layer structure. The memory element ME may have a thin-layer structure showing a magnetoresistance characteristic and may include at least one ferromagnetic material and/or at least one anti-ferromagnetic material.

In detail, the memory element ME may include a first magnetic structure MS1, a second magnetic structure MS2, and a tunnel barrier layer TBR disposed between the first and second magnetic structures MS1 and MS2. The first magnetic structure MS1, the second magnetic structure MS2, and the tunnel barrier layer TBR may be defined as a magnetic tunnel junction MTJ. Each of the first and second magnetic structures MS1 and MS2 may include at least one magnetic layer formed of a magnetic material. The memory element ME may further include a bottom electrode BE disposed between the second magnetic structure MS2 and the selection element SE and a top electrode TE disposed between the first magnetic structure MS1 and the bit line BL.

In an embodiment, as illustrated in FIG. 4, the memory element ME may have a thin-layer structure of which an electrical resistance value is changeable using a spin hall effect and/or a Rashba effect caused by a current passing through the bit line BL. The memory element ME may have a thin-layer structure showing a magnetoresistance characteristic and may include at least one ferromagnetic material and/or at least one anti-ferromagnetic material. According to the present embodiment, the bit line BL may include a first bit line layer BLL1 including a material having a great spin orbit coupling, and a second bit line layer BLL2 including a material having a lower resistivity than the first bit line layer BLL1.

In detail, in the present embodiment of FIG. 4, the memory element ME may include a first magnetic structure MS1, a second magnetic structure MS2, and a tunnel barrier layer TBR disposed between the first and second magnetic structures MS1 and MS2. The first magnetic structure MS1, the second magnetic structure MS2, and the tunnel barrier layer TBR may be defined as a magnetic tunnel junction MTJ. Each of the first and second magnetic structures MS1 and MS2 may include at least one magnetic layer formed of a magnetic material. The first magnetic structure MS1 may be in contact with the bit line BL. The memory element ME may further include a bottom electrode BE disposed between the second magnetic structure MS2 and the selection element SE.

Figure 5:
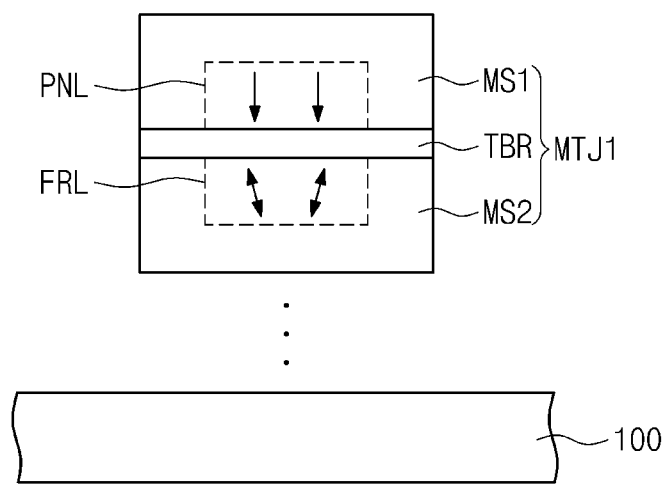
FIGS. 5 and 6 are views illustrating magnetic tunnel junctions according to example embodiments of the inventive concepts.
Figure 6:
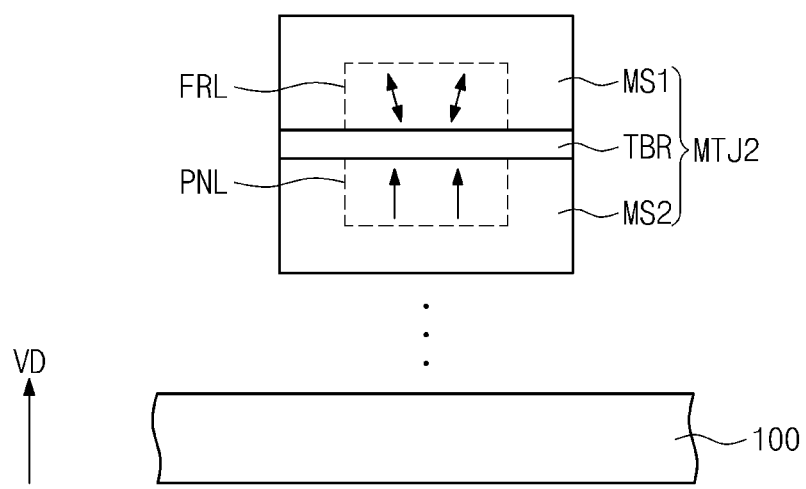

FIGS. 5 and 6 are views illustrating magnetic tunnel junctions according to example embodiments of the inventive concepts.

Referring to FIGS. 5 and 6, a magnetic tunnel junction MTJ may be provided on a substrate 100. The magnetic tunnel junction MTJ may include first and second magnetic structures MS1 and MS2 disposed on the substrate 100, and a tunnel barrier layer TBR disposed between the first and second magnetic structures MS1 and MS2. The second magnetic structure MS2 may be provided between the substrate 100 and the tunnel barrier layer TBR, and the first magnetic structure MS1 may be disposed on a top surface of the tunnel barrier layer TBR. The first magnetic structure MS1 may be spaced apart from the second magnetic structure MS2 with the tunnel barrier layer TBR interposed therebetween. In other word, the second magnetic structure MS2, the tunnel barrier layer TBR and the first magnetic structure MS1 may be sequentially stacked on the substrate 100.

One of a magnetic layer of the first magnetic structure MS1 and a magnetic layer of the second magnetic structure MS2 may have a fixed magnetization direction in a general usage environment, although an external magnetic field and/or spin torque is applied thereto. Hereinafter, the magnetic layer having the fixed magnetization direction is defined as a pinned layer PNL. The other of the magnetic layer of the first magnetic structure MS1 and the magnetic layer of the second magnetic structure MS2 may have a switchable magnetization direction by an external magnetic field and/or spin torque applied thereto. Hereinafter, the magnetic layer having the switchable magnetization direction is defined as a free layer FRL. The magnetic tunnel junction MTJ may include at least one free layer FRL and at least one pinned layer PNL which are separated from each other by the tunnel barrier layer TBR.

The magnetic tunnel junction MTJ may have one of the following two types according to a formation order of the free layer FRL and the pinned layer PNL.

In an embodiment, as illustrated in FIG. 5, the magnetic tunnel junction MTJ may be a first-type magnetic tunnel junction MTJ1 of which a first magnetic structure MS1 and a second magnetic structure MS2 include the pinned layer PNL and the free layer FRL, respectively. In an embodiment, as illustrated in FIG. 6, the magnetic tunnel junction MTJ may be a second-type magnetic tunnel junction MTJ2 of which a first magnetic structure MS1 and a second magnetic structure MS2 include the free layer FRL and the pinned layer PNL, respectively.

The electrical resistance of the magnetic tunnel junction MTJ may depend on the magnetization directions of the free layer FRL and the pinned layer PNL. For example, the electrical resistance of the magnetic tunnel junction MTJ when the magnetization directions of the free and pinned layers FRL and PNL are substantially anti-parallel to each other may be much greater than that of the magnetic tunnel junction MTJ when the magnetization directions of the free and pinned layers FRL and PNL are substantially parallel to each other. As a result, the electrical resistance of the magnetic tunnel junction MTJ may be adjusted by changing the magnetization direction of the free layer FRL, and this principle may be used as a data storage principle of the magnetic memory device according to the inventive concepts.

The tunnel barrier layer TBR may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). In an embodiment, the tunnel barrier layer TBR may be a magnesium oxide (MgO) layer. Alternatively, the tunnel barrier layer TBR may include a plurality of layers, and each of the plurality of layers may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). For example, a thickness of the tunnel barrier layer TBR may range from about 5☐ to about 15☐.

The pinned layer PNL may be formed of a magnetic material having an intrinsic perpendicular magnetization characteristic, hereinafter, referred to as 'a perpendicular magnetic material'. Here, the intrinsic perpendicular magnetization characteristic means that a magnetic layer has a magnetization direction perpendicular to a top surface thereof (i.e., an easy axis of the magnetic layer is perpendicular to a top surface thereof) when an external factor does not exist. For example, when the magnetic layer having the perpendicular magnetization characteristic is formed on a substrate, the magnetization direction of the magnetic layer may be parallel or anti-parallel to a direction perpendicular to a top surface of the substrate. Thus, the magnetization direction of the pinned layer PNL may be perpendicular to a top surface thereof.

The pinned layer PNL may have a single-layered or multi-layered structure including at least one of perpendicular magnetic materials including cobalt. In example embodiments, the pinned layer PNL may have a single-layered or multi-layer structure including a cobalt-platinum alloy or a cobalt-platinum alloy including an element X (where the element X is at least one of boron, ruthenium, chromium, tantalum, or an oxide). In example embodiments, the pinned layer PNL may have a multi-layered structure including cobalt-containing layers and noble metal layers which are alternately and repeatedly stacked. In this case, the cobalt-containing layers may be formed of cobalt, cobalt-iron, cobalt-nickel, or cobalt-chromium, and the noble metal layers may be formed of platinum or palladium. In example embodiments, the pinned layer PNL may have a multi-layered structure that includes any one of the cobalt-platinum alloy and the cobalt-platinum alloy including the element X, at least one of the cobalt-containing layers, and at least one of the noble metal layers.

The above mentioned materials are provided as examples of the materials having the intrinsic perpendicular magnetization characteristic for the purpose of describing technical features of the inventive concepts. However, the inventive concepts are not limited thereto. In example embodiments, the pinned layer PNL may include at least one of ① cobalt-iron-terbium (CoFeTb) having a terbium content ratio of 10% or more, ② cobalt-iron-gadolinium (CoFeGd) having a gadolinium content ratio of 10% or more, ③ cobalt-iron-dysprosium (CoFeDy), ④ FePt having a L10 structure, ⑤ FePd having the L10 structure, ⑥ CoPd having the L10 structure, ⑦ CoPt having a L10 or L11 structure, ⑧ CoPt having a hexagonal close packed (HCP) Lattice structure, ⑨ alloys including at least one of the materials ① to ⑧ described above, or ⑩ a structure including magnetic layers and non-magnetic layers alternately and repeatedly stacked. The structure including the magnetic layers and the non-magnetic layers alternately and repeatedly stacked may include (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (where "n" is the number of bilayers).

The free layer FRL may include a perpendicular magnetic material doped with non-magnetic impurities. The perpendicular magnetic material may have an easy axis parallel to a direction VD perpendicular to the top surface of the free layer FRL when an external factor (e.g., the non-magnetic impurities) does not exist. For example, the perpendicular magnetic material of the free layer FRL may include at least one of cobalt-iron (CoFe), cobalt-iron-boron (CoFeB), cobalt-iron-terbium (CoFeTb) having a terbium content ratio of 10% or more, cobalt-iron-gadolinium (CoFeGd) having a gadolinium content ratio of 10% or more, cobalt-iron-dysprosium (CoFeDy), FePt having a L10 structure, FePd having the L10 structure, CoPd having the L10 structure, CoPt having the L10 structure, or CoPt having a hexagonal close packed (HCP) Lattice structure. Alternatively, even though not shown in the drawings, the perpendicular magnetic material of the free layer FRL may have a structure including magnetic layers and non-magnetic layers alternately and repeatedly stacked. For example, the structure including the magnetic layers and the non-magnetic layers alternately and repeatedly stacked may include (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (where "n" is the number of bilayers).

The non-magnetic impurities may be located in interstitial sites of a crystal lattice of the perpendicular magnetic material of the free layer FRL. The non-magnetic impurities may include a transition metal or a rare-earth element.

In some embodiments, the non-magnetic impurities may include at least one selected from a group consisting of transition metals and rare-earth elements which have spin-orbit coupling constants equal to or greater than 250 $cm^{-1}$ and smaller than 1000 $cm^{-1}$. For example, the non-magnetic impurities may include at least one of zinc (Zn), yttrium (Y), zirconium (Zr), niobium (Nb), molybdenum (Mo), technetium (Tc), lanthanum (La), cerium (Ce), or praseodymium (Pr). In this case, a concentration of the non-magnetic impurities may range from about 1 at % to about 10 at %. In some embodiments, the non-magnetic impurities may include at least one selected from a group consisting of transition metals and rare-earth elements which have spin-orbit coupling constants equal to or greater than 1000 $cm^{-1}$. For example, the non-magnetic impurities may include at least one of promethium (Pm), samarium (Sm), europium (Eu), gadolinium (Gd), terbium (Tb), dysprosium (Dy), holmium (Ho), holmium (Er), lutetium (Lu), hafnium (Hf), tantalum (Ta), tungsten (W), rhenium (Re), osmium (Os), iridium (Ir), platinum (Pt), gold (Au), or mercury (Hg). In this case, the concentration of the non-magnetic impurities may range from about 1 at % to about 5 at %.

In some embodiments, the non-magnetic impurities may include at least one of a transition metal having an atomic number equal to or greater than 30 and smaller than 60 or a rare-earth element having an atomic number equal to or greater than 30 and smaller than 60. In this case, the concentration of the non-magnetic impurities may range from about 1 at % to about 10 at %. In some embodiments, the non-magnetic impurities may include at least one of a transition metal having an atomic number equal to or greater than 60 or a rare-earth element having an atomic number equal to or greater than 60. In this case, the concentration of the non-magnetic impurities may range from about 1 at % to about 5 at %.

The free layer FRL may have magnetization directions tilted at an acute angle from the direction VD perpendicular to the top surface of the free layer FRL. The magnetization directions of the free layer FRL will be described in detail with reference to FIGS. 7A, 7B and 8.

Figure 7A:
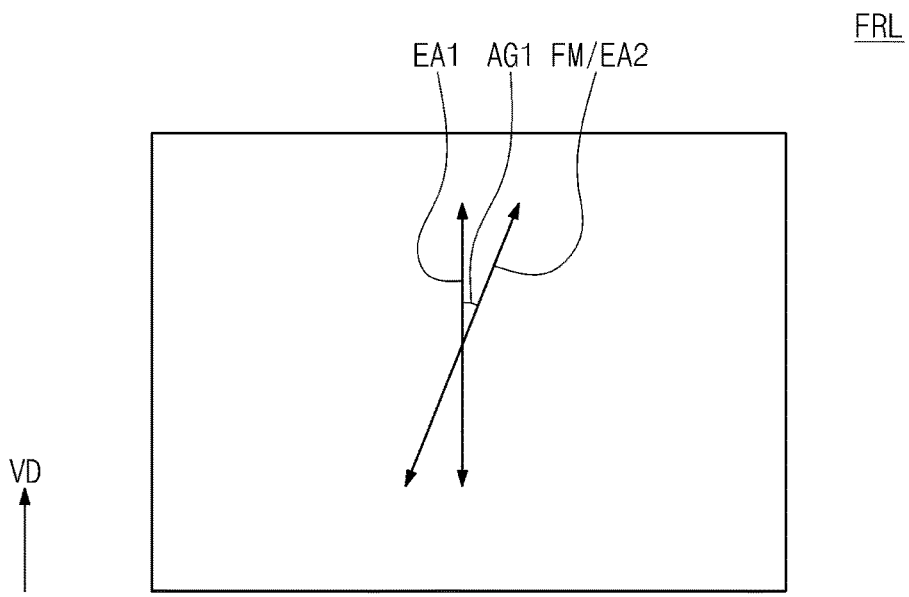
FIG. 7A is a conceptual diagram illustrating a magnetization direction of a free layer according to example embodiments of the inventive concepts.
Figure 7B:
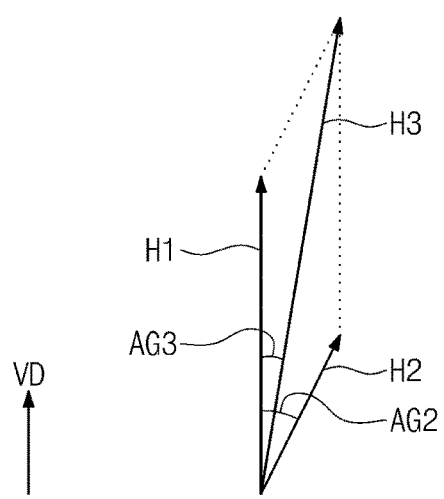
FIG. 7B is a conceptual diagram illustrating an anisotropic magnetic field of a free layer according to example embodiments of the inventive concepts.

FIG. 7A is a conceptual diagram illustrating a magnetization direction of a free layer according to example embodiments of the inventive concepts. FIG. 7B is a conceptual diagram illustrating an anisotropic magnetic field of a free layer according to example embodiments of the inventive concepts. Hereinafter, the magnetization direction of the free layer according to embodiments of the inventive concepts and the influence of the non-magnetic impurities upon the magnetization direction of the free layer will be described with reference to FIGS. 7A and 7B.

FIG. 7A illustrates an easy axis EA1 of the perpendicular magnetic material when an external factor (e.g., the non-magnetic impurity) does not exist, and an easy axis EA2 of the free layer FRL according to embodiments of the inventive concepts. The free layer FRL according to embodiments of the inventive concepts may include the perpendicular magnetic material doped with the non-magnetic impurities. The easy axis EA1 of the perpendicular magnetic material may be parallel to the direction VD perpendicular to the top surface of the free layer FRL. The easy axis EA2 of the free layer FRL may be tilted from the easy axis EA1 of the perpendicular magnetic material. According to embodiments of the inventive concepts, a first angle AG1 between the easy axis EA1 of the perpendicular magnetic material and the easy axis EA2 of the free layer FRL may be an acute angle. A magnetization direction FM of the free layer FRL may be parallel to or be along the easy axis EA2 of the free layer FRL.

FIG. 7A illustrates one magnetic domain of the free layer FRL for the purpose of ease and convenience in explanation and illumination. However, the free layer FRL may include a plurality of magnetic domains. Each of the magnetic domains may have the easy axis and the magnetization direction which are tilted at the first angle AG1 from the direction VD perpendicular to the top surface of the free layer FRL.

FIG. 7B illustrates an anisotropic magnetic field H1 by the perpendicular magnetic material, an anisotropic magnetic field H2 by spin-orbit interaction between the non-magnetic impurity and the perpendicular magnetic material, and an anisotropic magnetic field H3 of the free layer FRL in vector form.

The anisotropic magnetic field H1 by the perpendicular magnetic material may have a direction VD perpendicular to the top surface of the free layer FRL.

The anisotropic magnetic field H2 by the spin-orbit interaction between the non-magnetic impurity and the perpendicular magnetic material may be tilted at a second angle AG2 from the anisotropic magnetic field H1 by the perpendicular magnetic material. The spin-orbit interaction between the non-magnetic impurity and the perpendicular magnetic material may be Dzyaloshinskii-Moriya interaction.

The second angle AG2 between the anisotropic magnetic field H1 by the perpendicular magnetic material and the anisotropic magnetic field H2 by the spin-orbit interaction may be greater than 0 degree and smaller than 90 degrees. The second angle AG2 may be varied depending on the concentration and the spin-orbit coupling constant of the non-magnetic impurities. The second angle AG2 may increase as the concentration of the non-magnetic impurities increases and as the spin-orbit coupling constant of the non-magnetic impurities increases. The spin-orbit coupling constant of the non-magnetic impurities may be substantially proportional to the atomic number of the transition metal or rare-earth element included in the non-magnetic impurities. Thus, the second angle AG2 may increase as the atomic number of the transition metal or rare-earth element included in the non-magnetic impurities increases.

In an embodiment, in the case that the spin-orbit coupling constant of the non-magnetic impurities is equal to or greater than about 250 cm$^{-1}$ and smaller than about 1000 cm$^{-1}$ (or the atomic number of the transition metal or rare-earth element included in the non-magnetic impurities is equal to or greater than 30 and smaller than 60), the second angle AG2 may be substantially 0 degree when the concentration of the non-magnetic impurities is lower than about 1 at %, the second angle AG2 may be greater than 0 degree and smaller than 90 degrees when the concentration of the non-magnetic impurities ranges from about 1 at % to about 10 at %, and the second angle AG2 may be substantially 90 degrees when the concentration of the non-magnetic impurities is higher than about 10 at %. In this case, the non-magnetic impurities may include at least one of zinc (Zn), yttrium (Y), zirconium (Zr), niobium (Nb), molybdenum (Mo), technetium (Tc), lanthanum (La), cerium (Ce), or praseodymium (Pr).

In an embodiment, in the case that the spin-orbit coupling constant of the non-magnetic impurities is equal to or greater than about 1000 cm$^{-1}$ (or the atomic number of the transition metal or rare-earth element included in the non-magnetic impurities is equal to or greater than 60), the second angle AG2 may be substantially 0 degree when the concentration of the non-magnetic impurities is lower than about 1 at %, the second angle AG2 may be greater than 0 degree and smaller than 90 degrees when the concentration of the non-magnetic impurities ranges from about 1 at % to about 5 at %, and the second angle AG2 may be substantially 90 degrees when the concentration of the non-magnetic impurities is higher than about 5 at %. In this case, the non-magnetic impurities may include at least one of, but not limited to, promethium (Pm), samarium (Sm), europium (Eu), gadolinium (Gd), terbium (Tb), dysprosium (Dy), holmium (Ho), erbium (Er), lutetium (Lu), hafnium (Hf), tantalum (Ta), tungsten (W), rhenium (Re), osmium (Os), iridium (Ir), platinum (Pt), gold (Au), or mercury (Hg).

A magnitude of the anisotropic magnetic field H2 by the spin-orbit interaction between the non-magnetic impurity and the perpendicular magnetic material may also be varied depending on the concentration and the spin-orbit coupling constant of the non-magnetic impurities. In an embodiment, when the non-magnetic impurities has a low concentration (e.g., about 10 at % or less), the magnitude of the anisotropic magnetic field H2 by the spin-orbit interaction may be substantially proportional to the concentration of the non-magnetic impurities.

The anisotropic magnetic field H3 of the free layer FRL may be a sum of the anisotropic magnetic field H1 by the perpendicular magnetic material and the anisotropic magnetic field H2 by the spin-orbit interaction between the non-magnetic impurity and the perpendicular magnetic material. Thus, the anisotropic magnetic field H3 of the free layer FRL may be varied depending on the concentration and the spin-orbit coupling constant of the non-magnetic impurities. The anisotropic magnetic field H3 of the free layer FRL may form a third angle AG3 with the anisotropic magnetic field H1 by the perpendicular magnetic material.

In an embodiment, in the case that the spin-orbit coupling constant of the non-magnetic impurities is equal to or greater than about 250 cm$^{-1}$ and smaller than about 1000 cm$^{-1}$ (or the atomic number of the transition metal or rare-earth element included in the non-magnetic impurities is equal to or greater than 30 and smaller than 60), the third angle AG3 may be acute angle when the concentration of the non-magnetic impurities is in a range of about 1 at % to about 10 at %.

In an embodiment, in the case that the spin-orbit coupling constant of the non-magnetic impurities is equal to or greater than about 1000 cm$^{-1}$ (or the atomic number of the transition metal or rare-earth element included in the non-magnetic impurities is equal to or greater than 60), the third angle AG3 may be acute angle when the concentration of the non-magnetic impurities is in a range of about 1 at % to about 5 at %.

A magnitude of the anisotropic magnetic field H3 of the free layer FRL may be varied depending on the concentration and the spin-orbit coupling constant of the non-magnetic impurities.

In an embodiment, in the case that the spin-orbit coupling constant of the non-magnetic impurities is equal to or greater than about 250 cm$^{-1}$ and smaller than about 1000 cm$^{-1}$ (or the atomic number of the transition metal or rare-earth element included in the non-magnetic impurities is equal to or greater than 30 and smaller than 60), the magnitude of the anisotropic magnetic field H3 of the free layer FRL may be maximized when the concentration of the non-magnetic impurities is in a range of about 1 at % to about 10 at %.

In an embodiment, in the case that the spin-orbit coupling constant of the non-magnetic impurities is equal to or greater than about 1000 cm$^{-1}$ (or the atomic number of the transition metal or rare-earth element included in the non-magnetic impurities is equal to or greater than 60), the magnitude of the anisotropic magnetic field H3 of the free layer FRL may be maximized when the concentration of the non-magnetic impurities is in a range of about 1 at % to about 5 at %.

The easy axis EA2 and magnetization direction FM of the free layer FRL may be the same as a direction of the anisotropic magnetic field H3 of the free layer FRL. In addition, a magnitude of anisotropic energy of the free layer FRL may be proportional to the magnitude of the anisotropic magnetic field H3 of the free layer FRL.

As a result, the magnitude of the anisotropic energy of the free layer FRL according to embodiments of the inventive concepts may be maximized in the case (i) that the spin-orbit coupling constant of the non-magnetic impurities is equal to or greater than about 250 cm$^{-1}$ and smaller than about 1000 cm$^{-1}$ (or the atomic number of the transition metal or rare-earth element included in the non-magnetic impurities is equal to or greater than 30 and smaller than 60) and the concentration of the non-magnetic impurities is in a range of about 1 at % to about 10 at %, and in the case (ii) that the spin-orbit coupling constant of the non-magnetic impurities is equal to or greater than about 1000 cm$^{-1}$ (or the atomic number of the transition metal or rare-earth element included in the non-magnetic impurities is equal to or greater than 60) and the concentration of the non-magnetic impurities is in a range of about 1 at % to about 5 at %. In such conditions, the easy axis EA2 and the magnetization direction FM of the free layer FRL may be tilted at the acute angle from the direction VD perpendicular to the top surface of the free layer FRL. As the concentration of the non-magnetic impurities increases, the tilt angle of the easy axis EA2 and the magnetization direction FM of the free layer FRL from the direction VD may increase.

Figure 8:
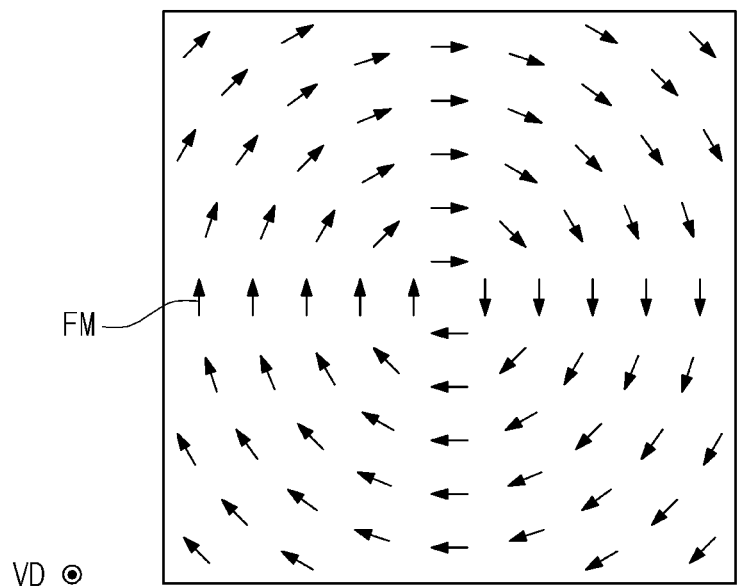
FIG. 8 is a plan view illustrating magnetization directions of a free layer according to example embodiments of the inventive concepts.

FIG. 8 is a plan view illustrating magnetization directions of a free layer according to example embodiments of the inventive concepts.

Referring to FIG. 8, the free layer FRL may include a plurality of magnetic domains. Magnetization directions FM of the plurality of magnetic domains may form a regular pattern when viewed from a plan view. For example, as illustrated in FIG. 8, the magnetization directions FM of the magnetic domains of the free layer may form a spiral pattern when viewed from a plan view. However, the inventive concepts are not limited thereto. The magnetization directions FM of the magnetic domains may form the regular pattern, so the magnetic domains may be in a stable energy state.

According to embodiments of the inventive concepts, the free layer may include the perpendicular magnetic material doped with the non-magnetic impurities. The spin-orbit interaction may occur between the perpendicular magnetic material and the non-magnetic impurities, and the anisotropic magnetic field thereby may affect the anisotropic magnetic field of the free layer. Thus, the anisotropic magnetic field and the anisotropic energy of the free layer may be increased. In addition, due to the anisotropic magnetic field by the spin-orbit interaction, the free layer may have the magnetization directions tilted at the acute angle from the direction perpendicular to the top surface of the free layer. For example, the free layer may include the plurality of magnetic domains, and each of the magnetic domains may have the easy axis and the magnetization direction which are tilted at the acute angle from the direction perpendicular to the top surface of the free layer. In the case that the free layer includes the plurality of magnetic domains, the free layer may have low domain wall energy. Thus, the free layer may have a low switching current density.

Figure 9:
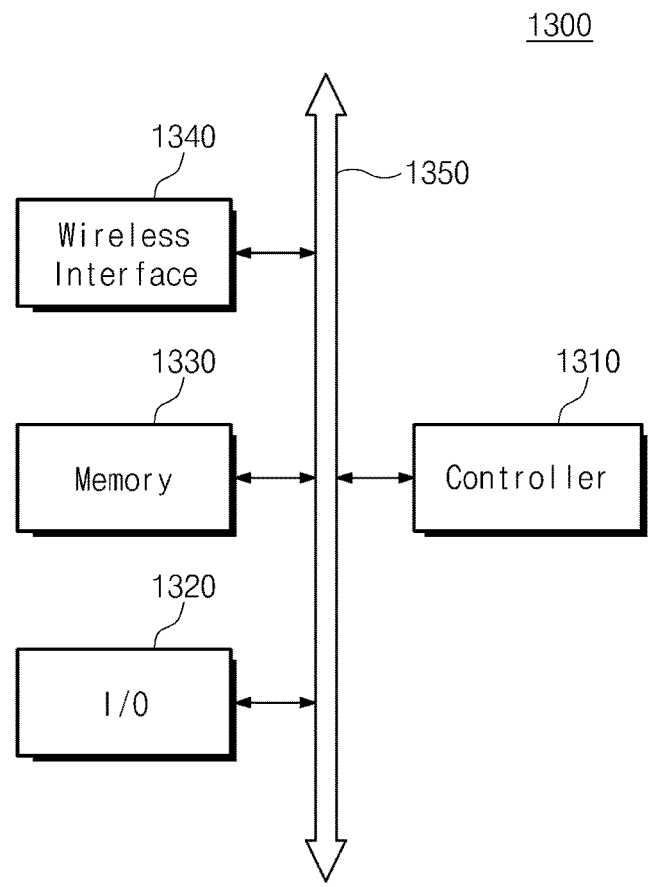
FIGS. 9 and 10 are schematic block diagrams illustrating electronic devices including semiconductor devices according to example embodiments of the inventive concepts.
Figure 10:
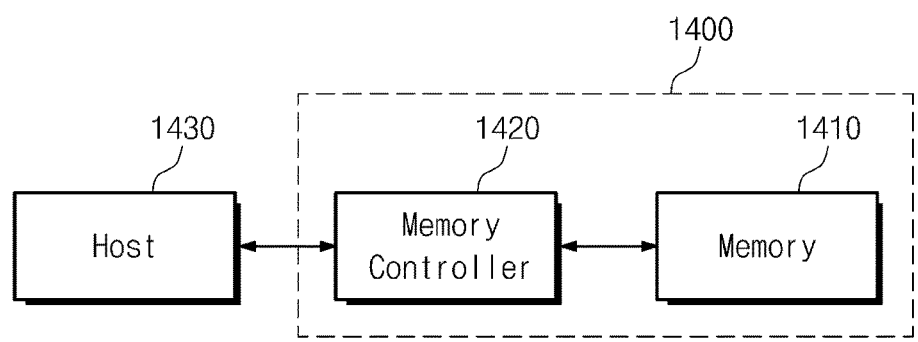

FIGS. 9 and 10 are schematic block diagrams illustrating electronic devices including semiconductor devices according to example embodiments of the inventive concepts.

Referring to FIG. 9, an electronic device 1300 including the semiconductor device according to the inventive concepts may be one of a personal digital assistant (PDA), a laptop computer, a portable computer, a web tablet, a wireless phone, a mobile phone, a digital music player, a cable/wireless electronic device, or any complex electronic device including at least two thereof. The electronic device 1300 may include a controller 1310, an input/output (I/O) unit 1320 (e.g., a keypad, a keyboard, and/or a display device), a memory device 1330, and a wireless interface unit 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands executed by the controller 1310. Additionally, the memory device 1330 may further store user's data. The memory device 1330 may include at least one of the semiconductor devices (i.e., the magnetic memory devices) according to the aforementioned embodiments of the inventive concepts. The electronic device 1300 may use the wireless interface unit 1340 to transmit data to a wireless communication network communicating using a radio frequency (RF) signal and/or to receive data from the communication network. For example, the wireless interface unit 1340 may include antenna or a wireless transceiver. The electronic device 1300 may be used in order to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 10, the semiconductor devices according to embodiments of the inventive concepts may be used to realize memory systems. A memory system 1400 may include a memory device 1410 and a memory controller 1420 which are used to store massive data. The memory controller 1420 may control the memory device 1410 to read/write data from/into the memory device 1410 in response to read/write requests of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices (i.e., the magnetic memory devices) according to the above embodiments of the inventive concepts.

The semiconductor devices described in above embodiments of the inventive concepts may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and a wafer-level processed stack package (WSP) technique.

The package in which the semiconductor device according to one of the above embodiments is mounted may further include at least one semiconductor device (e.g., a controller and/or a logic device) that controls the semiconductor memory device.

According to embodiments of the inventive concepts, the free layer may include the perpendicular magnetic material doped with the non-magnetic impurities. The spin-orbit interaction may occur between the perpendicular magnetic material and the non-magnetic impurities, and the anisotropic magnetic field thereby may affect the anisotropic magnetic field of the free layer. Thus, the anisotropic magnetic field and the anisotropic energy of the free layer may be increased. Additionally, the anisotropic magnetic field by the spin-orbit interaction may allow the free layer to have the magnetization direction tilted at the acute angle from the direction perpendicular to the top surface of the free layer. In an embodiment, the free layer may include the plurality of magnetic domains, and each of the magnetic domains may have the easy axis and the magnetization direction which are tilted at the acute angle from the direction perpendicular to the top surface of the free layer. Since the free layer includes the plurality of magnetic domains, the free layer may have low domain wall energy. Thus, the free layer may have a low switching current density.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
a magnetic tunnel junction comprising a free layer, a pinned layer, and a tunnel barrier layer between the free layer and the pinned layer,
wherein the free layer includes a perpendicular magnetic material doped with non-magnetic impurities,
wherein the non-magnetic impurities include a transition metal or a rare-earth element,
wherein the perpendicular magnetic material has a crystal lattice, and
wherein the transition metal of the non-magnetic impurities or the rare-earth element of the non-magnetic impurities is located at interstitial sites of the crystal lattice of the perpendicular magnetic material.

2. The magnetic memory device of claim 1,
wherein the non-magnetic impurities have an atomic number equal to or greater than 30 and smaller than 60.

3. The magnetic memory device of claim 2,
wherein a concentration of the non-magnetic impurities included in the free layer ranges from 1 at % to 10 at %.

4. The magnetic memory device of claim 1,
wherein the non-magnetic impurities have an atomic number equal to or greater than 60.

5. The magnetic memory device of claim 4,
wherein a concentration of the non-magnetic impurities included in the free layer ranges from 1 at % to 5 at %.

6. The magnetic memory device of claim 1,
wherein the non-magnetic impurities have a spin-orbit coupling constant equal to or greater than 250 cm$^{-1}$ and smaller than 1000 cm$^{-1}$.

7. The magnetic memory device of claim 6,
wherein a concentration of the non-magnetic impurities included in the free layer ranges from 1 at % to 10 at %.

8. The magnetic memory device of claim 1,
wherein the non-magnetic impurities have a spin-orbit coupling constant equal to or greater than 1000 cm$^{-1}$.

9. The magnetic memory device of claim 8,
wherein a concentration of the non-magnetic impurities included in the free layer ranges from 1 at % to 5 at %.

10. The magnetic memory device of claim 1,
wherein the free layer has a magnetization direction tilted at an acute angle from a direction perpendicular to a top surface of the free layer.

11. The magnetic memory device of claim 10,
wherein the acute angle increases as a concentration of the non-magnetic impurities increases.

12. The magnetic memory device of claim 1,
wherein the free layer includes a plurality of magnetic domains, and
wherein each of the magnetic domains has a magnetization direction tilted at an acute angle from a direction perpendicular to a top surface of the free layer.

13. The magnetic memory device of claim 1,
wherein the pinned layer has a magnetization direction perpendicular to a top surface of the free layer.

14. The magnetic memory device of claim 1,
wherein spin-orbit interaction occurs between the perpendicular magnetic material and the non-magnetic impurities.

15. The magnetic memory device of claim 14,
wherein the spin-orbit interaction is Dzyaloshinskii-Moriya interaction.

16. A magnetic memory device comprising:
a magnetic tunnel junction comprising a free layer, a pinned layer, and a tunnel barrier layer between the free layer and the pinned layer,
wherein the free layer has a magnetization direction tilted at an acute angle from a direction perpendicular to a top surface of the free layer,
wherein the pinned layer has a magnetization direction perpendicular to the top surface of the free layer,
wherein the free layer is a perpendicular magnetic material doped with non-magnetic impurities,
wherein the non-magnetic impurities include a transition metal or a rare-earth element,
wherein the perpendicular magnetic material has a crystal lattice, and
wherein the transition metal of the non-magnetic impurities or the rare-earth element of the non-magnetic impurities is located at interstitial sites of the crystal lattice of the perpendicular magnetic material.

17. The magnetic memory device of claim 16,
wherein the free layer includes a perpendicular magnetic material doped with non-magnetic impurities, and
wherein the acute angle increases as a concentration of the non-magnetic impurities increases.

18. The magnetic memory device of claim 16,
wherein the free layer includes a plurality of magnetic domains, and
wherein each of the magnetic domains has a magnetization direction tilted at an acute angle from the direction perpendicular to the top surface of the free layer.

* * * * *